United States Patent [19]

Mokuo

[11] Patent Number: 5,406,092
[45] Date of Patent: Apr. 11, 1995

[54] APPARATUS AND METHOD USING OPTICAL SENSORS RECESSED IN CHANNEL WALLS FOR DETECTOR SUBSTRATES IN A SUPPORT

[75] Inventor: Shori Mokuo, Saga, Japan

[73] Assignees: Tokyo Electron Limited, Tokyo; Tokyo Electron Kyushu Limited, Tosu, both of Japan

[21] Appl. No.: 138,077

[22] Filed: Oct. 20, 1993

[30] Foreign Application Priority Data

Oct. 20, 1992 [JP] Japan .................................. 4-307750

[51] Int. Cl.$^6$ .......................... G01N 21/86; G01V 9/04
[52] U.S. Cl. ................................... 250/561; 414/936
[58] Field of Search ............ 250/561, 571, 221, 222.1; 356/375; 414/935, 936, 937, 938, DIG. 2

[56] References Cited

U.S. PATENT DOCUMENTS

| | | | |
|---|---|---|---|
| 5,183,378 | 2/1993 | Asano et al. | 414/757 |
| 5,206,627 | 4/1993 | Kato | 340/674 |
| 5,225,691 | 7/1993 | Powers et al. | 250/561 |
| 5,266,812 | 11/1993 | Mokuo | 250/561 |
| 5,327,921 | 7/1994 | Mokuo et al. | 134/182 |

*Primary Examiner*—David C. Nelms
*Assistant Examiner*—Steven L. Nichols
*Attorney, Agent, or Firm*—Oblon, Spivak, McClelland, Maier, & Neustadt

[57] ABSTRACT

A semiconductor wafer-detecting apparatus is provided with a main support body formed of synthetic resin. A pair of substantially-parallel longitudinal channels and a plurality of substantially-parallel transverse channels are formed in the main support body. The longitudinal channels are located away from each other by a predetermined distance, and the transverse channels are arranged at intervals corresponding to the intervals at which wafers are arranged. Between the adjacent transverse channels, a plurality of pairs of holding portions are defined such that each pair is associated with the longitudinal channels. A pair of light-emitting elements and a pair of light-receiving elements are alternately arranged with reference to the holding portions. The light-emitting elements of each pair have their light-emitting faces oriented in opposite directions; likewise, the light-receiving elements of each pair have their light-receiving faces oriented in opposite directions. The light-emitting elements of each pair and associated light-receiving elements jointly constitute respective optical sensors. The presence or absence of a wafer is determined by detecting whether or not light is shielded between the light-emitting and light-receiving elements of each optical sensor.

19 Claims, 9 Drawing Sheets

APPARATUS AND METHOD USING OPTICAL SENSORS RECESSED IN CHANNEL WALLS FOR DETECTOR SUBSTRATES IN A SUPPORT

BACKGROUND OF THE INVENTION

1. Field of the Invention

The present invention relates to an apparatus and a method for optically detecting a plurality of to-be-processed substrates, such as semiconductor wafers or LCD substrates, at one time.

2. Description of the Related Art

A detection apparatus of this type is employed, for example, in a system which is installed in a semiconductor-manufacturing factory so as to clean a large number of semiconductor wafers at one time.

In order to enhance the cleaning efficiency, a semiconductor wafer-cleaning system performs batch cleaning with respect to a number of wafers, e.g., twenty-five wafers. During the cleaning process, the wafers are held by a wafer chuck (i.e., transfer arm) such that they are spaced at regular intervals and their surfaces are kept vertical.

When the wafers are being cleaned, some of them may drop from the wafer chuck. Therefore, the semiconductor wafer-cleaning system incorporates a wafer-detecting apparatus. The wafer-detecting apparatus is generally referred to as a "wafer counter" and examines whether or not any one of the wafers contained in one batch is missing by checking the total number of in that batch. It also examines how the wafers are arranged.

Roughly speaking, a wafer-detecting apparatus adopts one of the following two types of structures:

The structure of the first type employs an optical wafer-detecting means made up of one light-emitting element and one light-receiving element. This optical wafer-detecting means is moved in the direction in which the wafers are arranged, so as to detect the wafers one by one.

The structure of the second type employs a plurality of pairs of light-emitting and light-receiving elements, and the number of the pairs are equal to the number of wafers contained in one batch. The wafer chuck is arranged such that the wafers are partly located in the optical paths between the respective pairs of light-emitting and light-receiving elements. In this state, the wafers are detected.

In the case where the number of wafers of one batch is twenty five, the second structure employs twenty-five pairs of light-emitting and light-receiving elements. The light-emitting and light-receiving elements are arranged alternately and are fixed to a support body by means of mounting plates. Even where two sides of the mounting plates are used, the number of mounting plates required is twenty six, wherein each of the two end plates can be used by its inside, only. Thus, the second structure requires a large number of components. It should also be noted that the mounting plates may be easily shifted from their right positions. If the mounting plates are shifted, the light-emitting and light-receiving surfaces of the paired elements do not become exactly opposite to each other, and the detection sensitivity of one pair becomes different from that of another.

Where twenty-five light-receiving elements are employed in the structure of the second type, twenty-five wafer detection signals will be produced from the output terminals of the light-receiving elements. If these wafer detection signals are output in parallel, twenty-five signal lines and two power supply lines will be required. In other words, either twenty-seven separate lines or a 27-core flat cable will be required. The use of such separate lines or a flat cable inevitably increases the possibility of the occurrence of contact defects or electrical disconnection. In addition, a signal processor is inevitably complicated in structure at the input port.

In order to reduce the number of signal lines required, pairs of light-emitting and light-receiving elements are divided into groups, e.g., five or seven groups, and the light-emitting elements are turned on in units of one group on the time divisional basis. Outputs from the light-receiving elements of each group are transmitted to the signal processor by way of the common terminals of the respective groups. The time-divisional system of this type is advantageous in that it does not require a large number of signal lines.

In the time-divisional system mentioned above, however, it is likely that the light-receiving elements of one group will be undesirably turned on in response to the light from the light-emitting elements of another group, resulting in the generation of error signals. This problem is due to the fact that the light-receiving elements are turned on whenever they receive light whose intensity is greater than the predetermined threshold value.

SUMMARY OF THE INVENTION

Accordingly, an object of the present invention is to provide a detection apparatus which is reliable in operation and simple in structure, and also to provide a reliable detection method.

According to a first aspect of the invention there is provided an apparatus for detecting a plurality of substrates arranged substantially parallel to one another at intervals, the apparatus comprising: a support member; a pair of substantially-parallel longitudinal channels which are formed in the support member, with a distance therebetween; a plurality of substantially-parallel transverse channels which are formed in the support member at intervals, the transverse channels being substantially perpendicular to the longitudinal channels, the intervals of the transverse channels corresponding to the intervals at which the substrates are arranged; a plurality of pairs of holding means, each pair of holding means being formed between adjacent ones of the transverse channels in association with the longitudinal channels; and a plurality of pairs of light-emitting and light-receiving elements arranged such that a pair of light-emitting elements and a pair of light-receiving elements are alternately arranged with reference to the holding means, the light-emitting elements of each pair having light-emitting faces oriented in opposite directions, the light-receiving elements of each pair having light-receiving elements oriented in opposite directions, the light-emitting elements of each pair being associated with light-receiving elements facing thereto so as to jointly constitute respective optical sensors, wherein each of the optical sensors determines the presence or absence of a substrate by detecting whether or not light between the light-emitting and light-receiving elements is shielded.

According to a second aspect of the invention there is provided an apparatus for detecting a plurality of substrates arranged substantially parallel to one another at intervals, the apparatus comprising: support means; a plurality of optical sensors including at least first to fourth optical sensors which are supported by the support means and which are arranged at intervals corresponding to the intervals at which the substrates are arranged, each of the plurality of optical sensors being made up of one light-emitting element and one light-receiving element and determining the presence or absence of a substrate by detecting whether or not light between the light-emitting and light-receiving elements is shielded; first reading means, electrically connected to output terminals of the light-receiving elements of the first and third optical sensors, for reading output signals of the first and third optical sensors; second reading means, electrically connected to output terminals of the light-receiving elements of the second and fourth optical sensors, for reading output signals of the second and fourth optical sensors; normally-open first switching means electrically connected to input terminals of the light-receiving elements of the first and second optical sensors; normally-open second switching means electrically connected to input terminals of the light-receiving elements of the third and fourth optical sensors; and selecting means for outputting first and second ON signals on a time divisional basis, the first ON signal controlling the light-emitting elements of the first and second optical sensors to emit light and closing the first switching means to set the light-receiving elements of the first and second optical sensors in an enabled state, the second ON signal controlling the light-emitting elements of the third and fourth optical sensors to emit light and closing the second switching means to set the light-receiving elements of the third and fourth optical sensors in an enabled state.

According to a third aspect of the invention there is provided a method for detecting a plurality of substrates arranged substantially parallel to one another at intervals, the method comprising the steps of: arranging a plurality of optical sensors at intervals corresponding to the intervals at which the substrates are arranged, each of the optical sensors being made up of one light-emitting element and one light-receiving element; positioning the substrates with reference to the optical sensors, such that one of the substrates is inserted between the light-emitting and light-receiving elements of one of the optical sensors; dividing the optical sensors into a plurality of groups, and outputting ON signals on a time divisional basis, each of the ON signals permitting the light-emitting elements of the optical sensors of one group to emit light and permitting the light-receiving elements of the optical sensors of the one group to be set in an enabled state; and determining the presence or absence of a substrate by reading how an output of the light-receiving element varies depending upon whether or not light between the light-emitting and the light-receiving elements is shielded.

In the detection apparatus of the present invention, the holding means for holding a large number of light-emitting and light-receiving elements are integral with the main body of the apparatus. Since an operation for coupling the holding means to the main body need not be performed, the assembling operation can be greatly simplified. In addition, since the holding means do not shake or slant with reference to the main body, the light-emitting and light-receiving elements can be held in a stable manner, with their desirable postures maintained.

In the detection apparatus and method of the present invention, the light-emitting elements are turned on in units of one group on a time divisional basis, and the light-receiving elements of each group are selectively turned on or off, depending upon whether or not substrates are located at their respective detection positions. When the light-emitting elements of one group are emitting light, the light-emitting elements of the other groups do not emit light. During the time, the light-receiving elements of the other groups are kept in the disenabled state, i.e., they are prevented from being turned on even when light greater than a threshold value is incident on them. Therefore, only the output signals of the light-receiving elements of the group whose light-emitting elements are operating, are supplied to the signal processor by way of the common terminals.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 12:
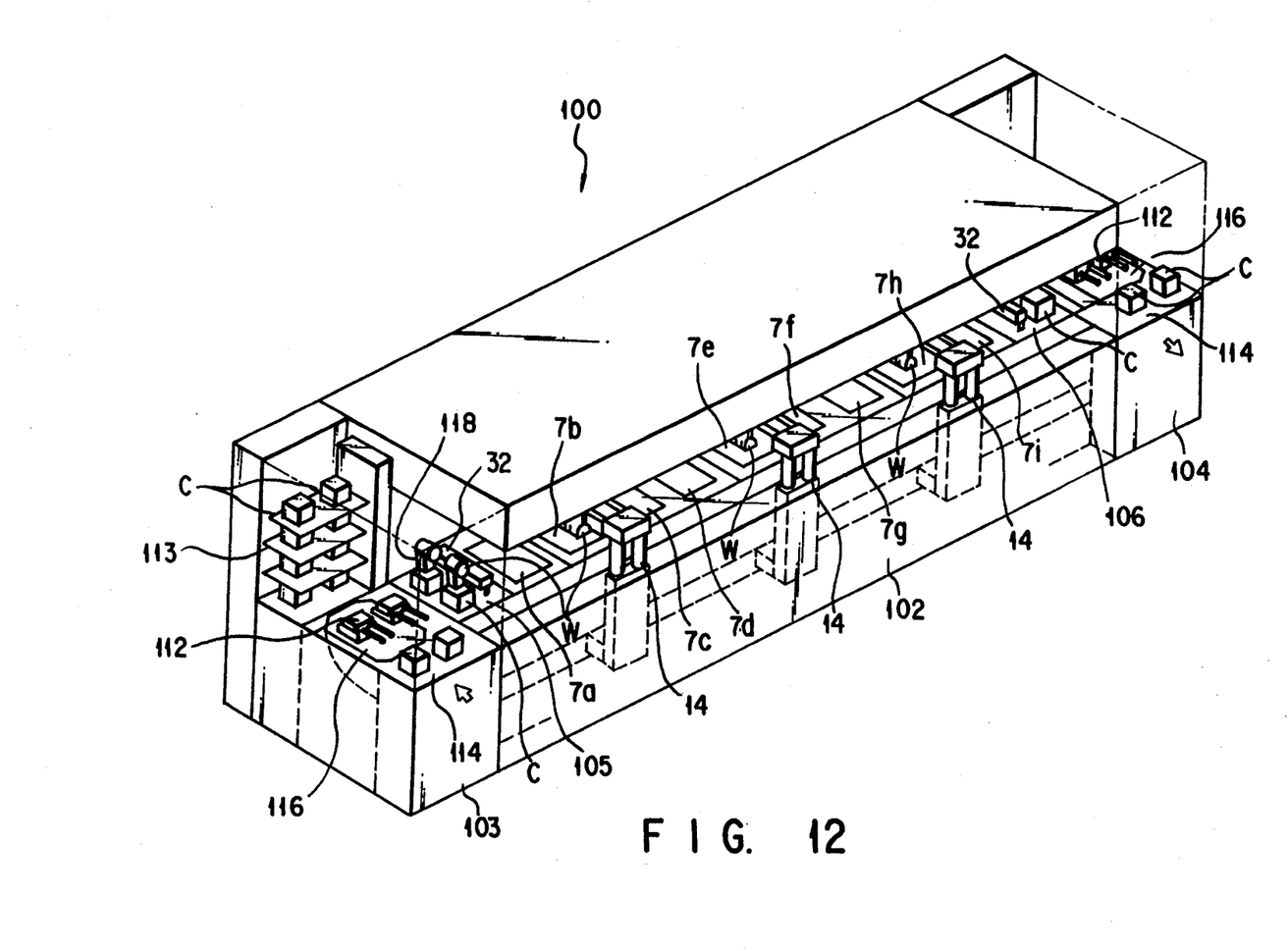
FIG. 12 is a perspective view showing the entire wafer-cleaning system depicted in FIG. 1.

The semiconductor wafer-cleaning system 100 shown in FIG. 12 employs two wafer-detecting apparatuses 32 embodying the present invention.

The cleaning system 100 is made up of three sections: namely, a cleaning section 102, an input buffer section 103, and an output buffer section 104. The input buffer section 103 is coupled to that side of the cleaning section 102 at which a loader unit 105 is located, while the output buffer section 104 is coupled to that side of the cleaning section 102 at which an unloader unit 106 is located. The mechanism constituted by the input buffer section 103 and the loader unit 105, and the mechanism constituted by the output buffer section 104 and the unloader unit 106 are symmetric in structure and have substantially the same mechanical characteristics.

Each of the input and output buffer sections 103 and 104 has a port 114. The port 114 of the input buffer section 103 enables insertion of two cassettes C; likewise, the port 114 of the output buffer section 104 enables ejection of two cassettes C. A predetermined number of wafers W, e.g., twenty-five 8-inch wafers W, can be stored in each of the cassettes C. Each of the buffer sections 103 and 104 comprises a stocker 113 located at a back region and capable of storing eight cassettes C (two cassettes on each shelf). Each of the buffer sections 103 and 104 also comprises two liftable cassette transfer members 112. The cassette transfer members 112 are placed on a turntable 116 and can be rotated such that they face the port 114, the stocker 113, and the cleaning section 102. The cassettes C are conveyed in pairs by one cassette transfer member 112 and transferred between the port 114, the stocker 113, and the cleaning section 102.

Each of the loader and unloader units 105 and 106 comprises a pushing member 118 for pushing up wafers from a cassette C. Being pushed up or raised by the pushing member 118, the wafers are transferred from the cassette C to a wafer chuck 18 (FIG. 1), which will be described below. In each of the loader and unloader units 105 and 106, a wafer-detecting apparatus 32 embodying the present invention is located adjacent to the pushing member 118.

Nine processing tubs 7a–7i are arranged in the cleaning section 102 located between the loader and unloader units 105 and 106. Processing tubs 7a and 7h are used for cleaning the wafer chuck 18, processing tubs 7b and 7e are used for cleaning the wafers in chemicals, processing tubs 7c, 7d, 7f and 7g are used for cleaning the wafers with water, and processing tub 7i is used for drying the wafers.

Figure 1:
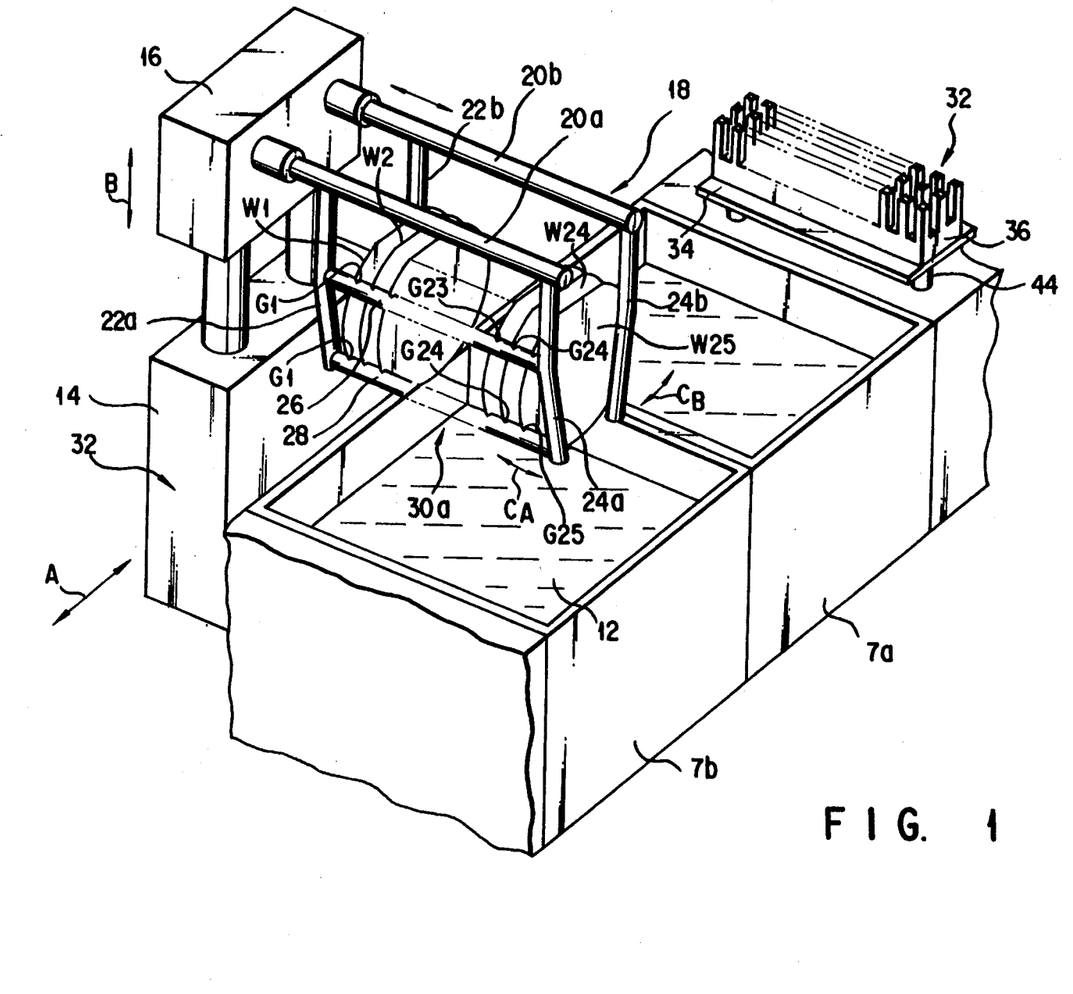
FIG. 1 is a perspective view showing part of a wafer-cleaning system which employs a wafer-detecting apparatus according to one embodiment of the present invention.

Three wafer-conveying robots 14 are movably arranged in the direction in which the processing tubs 7a–7i are arranged. Each of the robots 14 comprises a liftable wafer chuck 18 (FIG. 1). The wafer chuck 18 can hold fifty wafers (a maximum number) at one time. Wafers to be processed are taken out from the cassettes and held by the chuck 18 of one robot. The number of wafers is counted by the wafer-detecting apparatus 32 in the state where the wafers are held by the chuck 18. Subsequently, the wafers are conveyed to processing tubs 7b, 7c, 7d, 7e, 7f, 7g and 7i in the order mentioned, for cleaning. After this cleaning, the number of wafers is counted again by the wafer-detecting apparatus 32 of the unloader unit 106. Then, the wafers are stored in empty cassettes.

FIG. 1 is a perspective view showing, in an enlarged scale, how the wafer-detecting apparatus 32 of the loader unit 105 is associated with processing tubs 7a and 7b. Referring to FIG. 1, the wafer conveying robot 14 is movable in direction A, along the wafer-detecting apparatus 32, processing tubs 7a and 7b, and the processing tubs (FIG. 12) located downstream of processing tubs 7a and 7b. A chuck driver 16, being movable in the vertical direction (direction B), is mounted on the robot 14, and a wafer chuck 18 is coupled to the wafer driver 16.

The wafer chuck 18 comprises a pair of horizontal main rods 20a and 20b coupled to the chuck driver 16 and being rotatable and extensible, a pair of vertical rods 24a and 24b coupled to the distal ends of the horizontal main rods 20a and 20b, and a pair of vertical rods 22a and 22b coupled to the proximal ends of the horizontal main rods 20a and 20b. Two wafer support rods 26 and 28 horizontally extend between vertical rods 22a and 24a; likewise, two wafer support rods 26 and 28 (illustration of which is omitted from FIG. 1) horizontally extend between vertical rods 22b and 24b. Horizontal main rod 20a, vertical rods 22a and 24a, and wafer support rods 26 and 28 jointly constitute one wafer-clamping arm 30a of the wafer chuck 18; likewise horizontal main rod 20b of the wafer chuck 18, vertical rods 22b and 24b, and wafer support rods 26 and 28 jointly constitute the other wafer-clamping arm 30b of the wafer chuck 18.

When horizontal main rods 20a and 20b are rotated by the chuck driver 16, wafer-clamping arms 30a and 30b are moved in the directions indicated by arrows CA and CB, respectively, thus permitting a batch of wafers W1 to W25 to be clamped at one time. Grooves G1 to G25 are formed in each of the wafer support rods 26 and 28 at regular intervals, such that the wafers W1 to W25 can be vertically held by the wafer chuck 18. As depicted in FIG. 1, the wafers W1 to W25 are held by the wafer chuck 18, with their lower portions projected from the lower wafer support rods 28.

The state depicted in FIG. 1 is a precleaning state, i.e., a state where the wafers W1 to W25 are to be immersed in the chemical 12 (i.e., a processing liquid) contained in processing tub 7b. To clean the wafers W1 to W25, the wafer chuck 18 is lowered into processing tub 7b by the downward movement of the chuck driver 16, so as to immerse the wafers W1 to W25 in the processing liquid 12.

As shown in FIG. 12, in the present embodiment, one of the wafer-detecting apparatuses 32 is located in the path along which the wafer chuck 18 moves between the position where wafers are clamped by the wafer chuck 18 in the loader unit 105 and the position where the first processing of the wafers is performed in tub 7b. The other wafer-detecting apparatus 32 is located in the path along which the wafer chuck 18 moves between the position where the last processing of the wafers is performed in tub 7i and the position where the wafers are released from the wafer chuck 18 in the unloader unit 106.

Before and after the cleaning processing, the wafer-conveying robots 14 and the chuck driver 16 move the wafer chuck 18 to the positions over the wafer-detecting apparatuses, so that the wafers W1 to W25 are arranged at the wafer detection positions (to be described later) of the wafer-detecting apparatuses 32, so as to check the presence/absence of each wafer.

Figure 2:
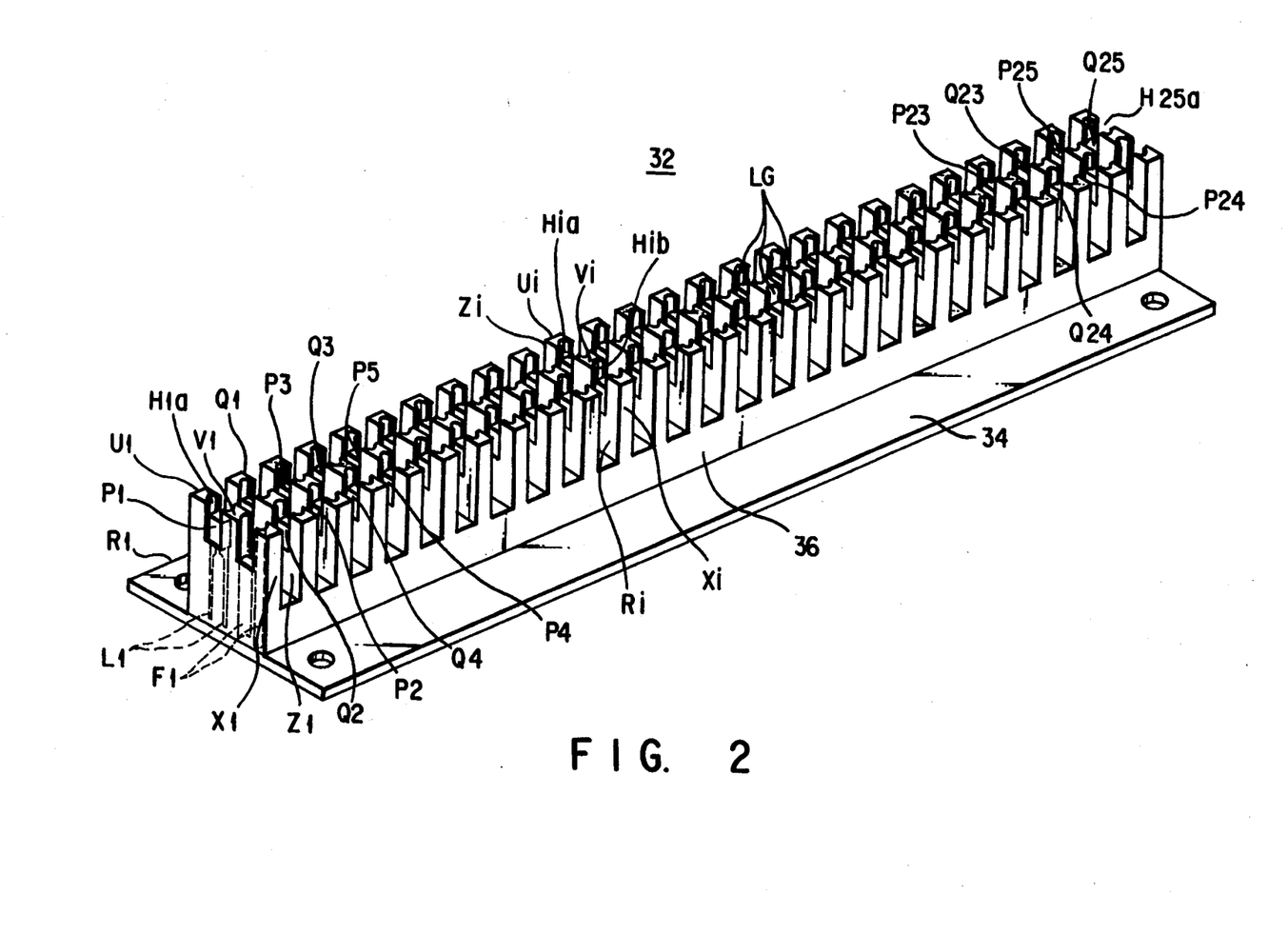
FIG. 2 is a perspective view showing the major portion of the wafer-detecting apparatus depicted in FIG. 1.

Detailed structures of the wafer-detecting apparatus 32 are shown in FIG. 2. As shown, the wafer-detecting apparatus 32 is made up of a base plate 34 having a printed circuit on the reverse side thereof, and a block-like main body 36 placed on the base plate 34. A large number of holding portions, for example, 26×2 holding portions H1a, H1b to H25a, H25b are formed on the main body 36 and are integral therewith. Twenty-five light-emitting elements P1 to P25 and twenty-five light-receiving elements Q1 to Q25 are held by the respective holding portions H1a, H1b to H25a, H25b.

The holding portions Hia and Hib of each pair are made up of one plate-like support portion Ri extending upward from the main body 36, and three holding pieces Ui, Vi and Xi extending upward from the plate-like support portion Ri and spaced from one another in the width direction of the main body 36. A longitudinal groove LG is formed in the inner faces of holding pieces Ui and Xi and in the two side faces of holding piece Vi, in such a manner that a light-emitting element Pi or a light-receiving element Qi can be inserted between the adjacent holding pieces. The plate-like support portion Ri has a through-hole Fi, through which the lead terminals of the light-emitting and light-receiving elements Pi and Qi extend to the reverse side of the base plate 34.

Each of light-emitting and light-receiving elements Pi and Qi comprises a plate-like element body and a pair of lead terminals Li projected downward from the lower face of the element body. In order to immovably hold the light-emitting or light-receiving element Pi or Qi, the element body is slid along the adjacent holding pieces (Ui and Vi) or (Xi and Vi), with the lead terminals inserted into the through-hole Fi of the plate-like support portion Ri.

Figure 3:
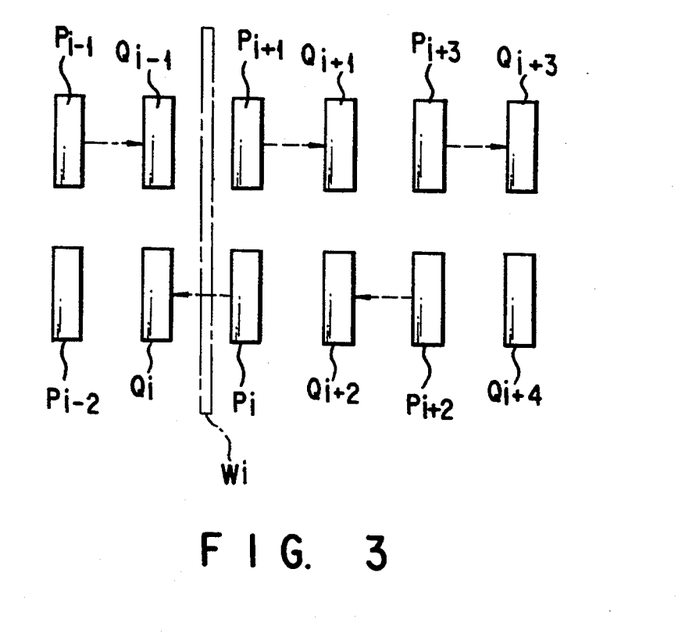
FIG. 3 is a schematic plan view showing how the light-emitting and light-receiving elements of the wafer-detecting apparatus are arranged.

A description will be given as to how the light-emitting and light-receiving elements Pi and Qi are arranged and how their light-emitting and light-receiving faces are oriented. The arrangement of the light-emitting and light-receiving elements Pi and Qi is shown in FIG. 2. As shown, a pair of light-emitting elements Pi and Pi+1 and a pair of light-receiving elements Qi and Qi+1 are alternately arranged in the longitudinal direction of the main body 36, except that only one light-emitting element P1 and only one light-receiving element Q25 are arranged at the respective ends of the main body 36. The orientation of the light-emitting and light-receiving faces is shown in FIG. 3. As shown, light-emitting elements Pi and Pi+1 of each pair are arranged, with their light-emitting faces oriented in the opposite directions; likewise, light-receiving elements Qi and Qi+1 of each pair are arranged, with their light-receiving faces orientated in the opposite directions. Since, as described above, a pair of light-emitting elements Pi and Pi+1 and a pair of light-receiving elements Qi and Qi+1 are alternately arranged, light-emitting element Pi and light-receiving element Qi face each other, with the wafer detection position Zi (i.e. the space between the adjacent holding portions) located therebetween.

Figure 4:
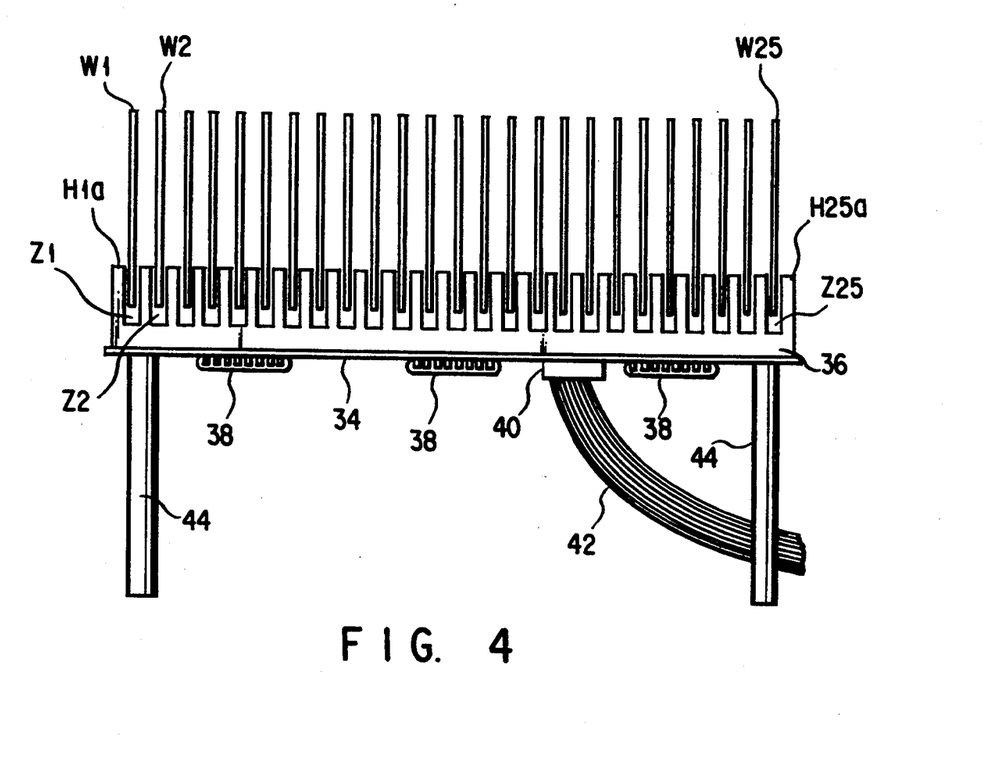
FIG. 4 is a front view showing the entire wafer-detecting apparatus depicted in FIG. 1.

FIG. 4 is a schematic side view showing the entire wafer-detecting apparatus. In the state depicted in FIG. 4, wafers W1 to W25 held by the wafer chuck 18 (not shown in FIG. 4) are inserted in the respective wafer detection positions Z1 to Z25, for checking the number of wafers. Circuit components 38 (e.g., integrated circuits), a connector 40, etc. are mounted on the reverse side of the base plate 34, and the circuit components 38 are electrically connected to an external circuit by means of a flat cable 42. Stays 44 for supporting the entire apparatus are coupled to the ends of the base plate 34.

A description will now be given, with reference to FIGS. 5A–5D, of the working steps for integrally forming the main body 36 and holding portions H1a, H1b to H25a, H25b of the wafer-detecting apparatus 32.

Figure 5A:
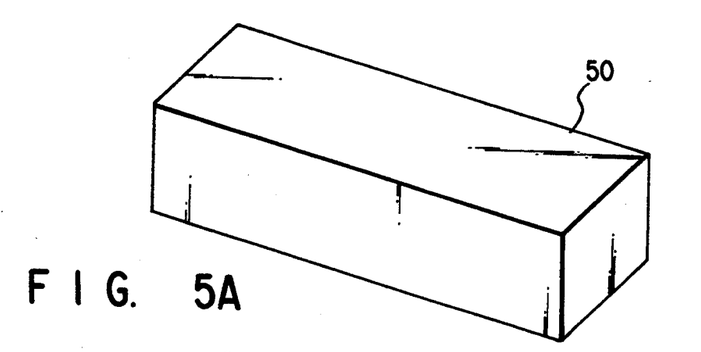
FIGS. 5A–5D are perspective views showing how the main body of the wafer-detecting apparatus is manufactured.
Figure 5B:
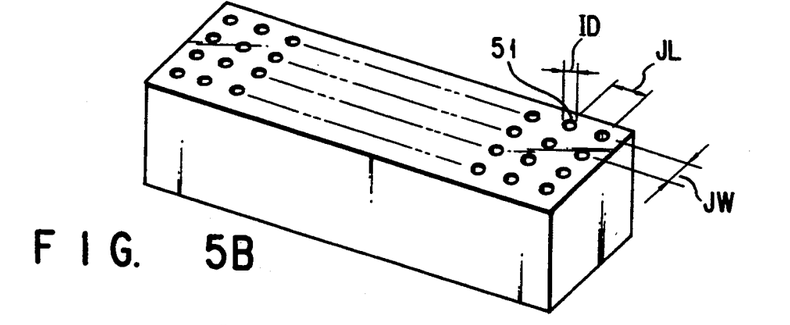

As shown in FIG. 5A, a long rectangular parallelepipedic block having predetermined dimensions is formed of either a plastic material or a resin such as an acrylic resin. Then, as shown in FIG. 5B, a large number of through-holes are formed in the block by means of a drill or the like, such that four through-holes are aligned in the width direction of the block and twenty-six through holes are aligned in the longitudinal direction of the block (a 4×26 pattern). The throughholes constitute the grooves LG of the holding portions H and the through-holes F of the plate-like support portions R, and each of the through-hole has a diameter of ID. The pitch JL of the through-holes in the longitudinal direction of the block, and the pith JW of the through-holes in the width direction of the block are predetermined. Thereafter, as shown in FIG. 5C, two channels, each extending in the longitudinal direction of the block and having a predetermined depth De, are formed in the block by cutting out those portions of the block which are located between the adjacent two through-holes by means of an end mill or the like.

Figure 5C:
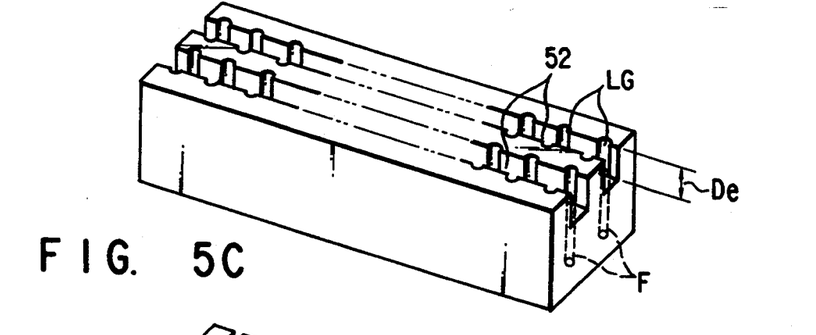
Figure 5D:
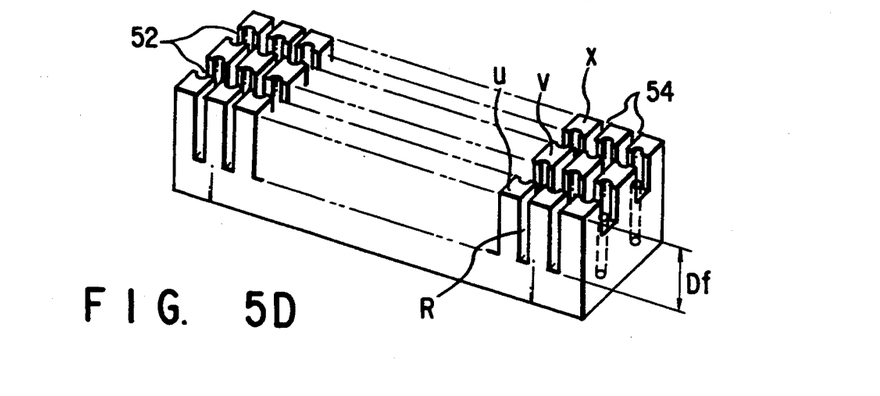

As shown in FIG. 5C, semicircular holes remain in the inner faces of the channels 52, thus constituting the grooves LG of the holding portions. Subsequently, as shown in FIG. 5D, a large number of channels 54, each extending in the width direction of the block and having a predetermined depth Df, are formed in the block by cutting out those portions of the block which are located between the adjacent two semicircular holes by means of an end mill or the like. As a result of this working, the plate-like support portions R and the holding pieces U, V and X are defined by the grooves 52 and 54. Grooves 52 determine the positions where the light-emitting and light-receiving elements Pi and Qi are arranged, and grooves 54 determine the wafer detection positions Z.

In the manner described above, the main body 36, and holding portions H1a, H1b to H25a, H25b integral with the main body can be formed from one block by cutting and drilling. The use of an NC (numeral control) lathe is preferable during the working of the block. The light-emitting elements P1 to P25 and the light-receiving elements Q1 to Q25 can be immovably held by inserting them in the holding portions H1a, H1b to H25a, H25b.

In the wafer-detecting apparatus of the embodiment, the holding portions H1a, H1b to H25a, H25b for holding the light-emitting and light-receiving elements P1–P25 and Q1–Q25 are integral with the main body 36. Therefore, separate members need not be prepared for forming the holding portions, and the assembly of the wafer-detecting apparatus can be greatly simplified. In addition, since the holding portions do not shake or slant with reference to the main body 36, the light-emitting and light-receiving elements P1–P25 and Q1–Q25 can be vertically held in a stable manner. As the light-emitting element Pi and the corresponding light-receiving element Qi are substantially parallel, uniform detection sensitivity is ensured.

Figure 6:
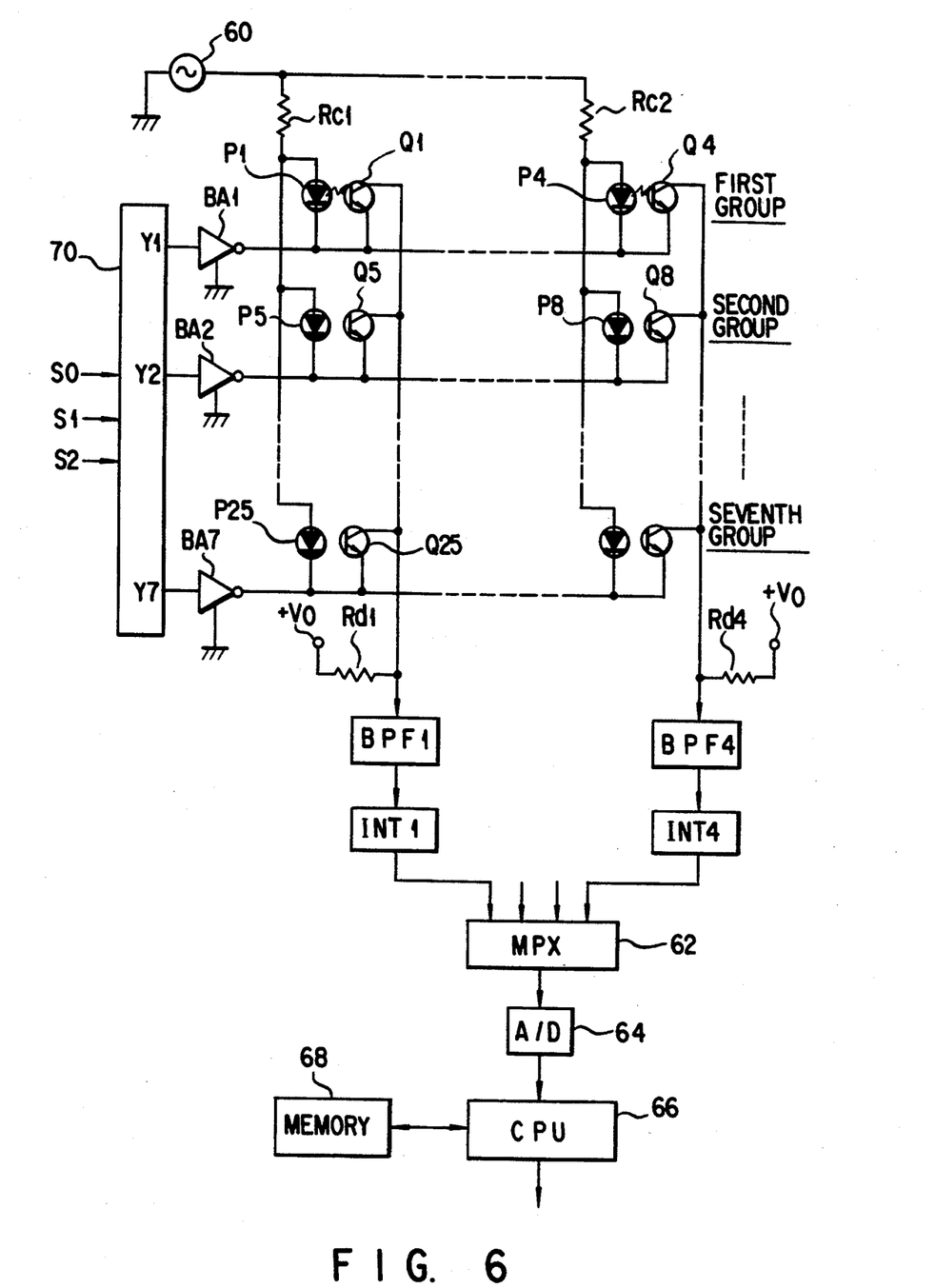
FIG. 6 is a block circuit diagram showing the electrical circuit of the wafer-detecting apparatus.

FIG. 6 is a block circuit diagram showing the electrical circuit of the wafer-detecting apparatus 32. In the wafer-detecting apparatus 32, the twenty-five wafer-detecting means (P1, Q1) to (P25, Q25) are divided into seven groups: a first group of (P1–P4 and Q1–Q4), a second group of (P5–P8 and Q5–Q8), a third group of (P9–P12 and Q9–Q12), a fourth group of (P13–P16 and Q13–Q16), a fifth group of (P17–P20 and Q17–Q20), a sixth group of (P21–P24 and Q21–Q24), and a seventh group of (P25 and Q25).

In the first group, the anodes of four light-emitting diodes, which respectively constitute the four light-emitting elements P1 to P4, are connected to the output terminal of the same high-frequency power supply 60 by way of respective resistors Rc1 to Rc4, while the cathodes of the four light-emitting diodes are connected in common to the output terminal of a buffer amplifier BA1. The collectors of four phototransistors, which respectively constitute the four light-receiving elements Q1 to Q4, are connected to a power supply terminal +V0 by way of respective resistors Rd1 to Rd4, and are also connected to the input terminals of band-pass filters BPF1 to BPF4. The emitters of the four phototransistors are connected in common to the output terminal of the buffer amplifier BA1.

In the second group, the anodes of four light-emitting diodes, which respectively constitute the four light-emitting elements P5 to P8, are connected to the output terminal of the high-frequency power supply 60 by way of the respective resistors Rc1 to Rc4, while the cathodes of the four light-emitting diodes are connected in common to the output terminal of a buffer amplifier BA2. The collectors of four phototransistors, which respectively constitute the four light-receiving elements Q5 to Q8, are connected to the power supply terminal +V0 by way of the respective resistors Rd1 to Rd4, and are also connected to the input terminals of band-pass filters BPF1 to BPF4. The emitters of the four phototransistors are connected in common to the output terminal of the buffer amplifier BA2.

Likewise, in each of the third to sixth groups, four light-emitting diodes, which respectively constitute the four light-emitting elements (P9 to P12), (P13 to P16), (P17 to P20), or (P21 to P24), are connected in parallel between the high-frequency power supply 60 and buffer amplifiers BA3 to BA6 (not shown). Four phototransistors, which respectively constitute the four light-receiving elements (Q9 to Q12), (Q13 to Q16), (Q17 to Q20), or (Q21 to Q24), are connected in parallel between the power supply terminal +V0 and band-pass filters (BPF1 to BPF4) on one hand and the buffer amplifiers BA3 to BA6 on the other. In the seventh group, one light-emitting diode, which constitutes the light-emitting element P25, is connected between the high-frequency power supply 60 and a buffer amplifier BA7. One phototransistor, which constitutes the light-receiving element Q25, is connected between the power supply terminal +V0 and band-pass filter (BPF1) on one hand and the buffer amplifier BA7 on the other.

The twenty-five light-emitting elements P1–P25 and twenty-five light-receiving elements Q1–Q25 are connected in such a manner as to form a matrix pattern. As may be understood from the above description, the collector terminals (output terminals) of light-receiving elements Q1, Q5 ... Q25 of different groups are connected in common to the input terminal of band-pass filter BPF1, the collector terminals (output terminals) of light-receiving elements Q2, Q6 ... Q22 of different groups are connected in common to the input terminal of band-pass filter BPF2 (not shown), the collector terminals (output terminals) of light-receiving elements Q3, Q7 ... Q23 of different groups are connected in common to the input terminal of band-pass filter BPF3, and the collector terminals (output terminals) of light-receiving elements Q4, Q8 ... Q24 of different groups are connected in common to the input terminal of band-pass filter BPF4.

The output terminals of band-pass filters BPF1 to BPF4 are connected to the input terminals of integrators INT1 to INT4, respectively, and the output terminals of the integrators INT1 to INT4 are connected to the input terminals of a multiplexer (MPX) 62. The output terminal of the multiplexer 62 is connected to the input terminal of an A/D (analog-to-digital) converter 64, and the output terminal of the A/D converter 64 is connected to the input terminal of a CPU (a microprocessor) 66. CPU 66 is connected to a memory 68 (e.g., a ROM, a RAM, or the like), and is connected also to a peripheral device (e.g., a display device) by way of a suitable interface.

The input terminals of buffer amplifiers BA1 to BA7 are connected to the output terminals Y1 to Y7 of a selector circuit 70 (which is made by a decoder), respectively. The selector circuit 70 is supplied with a group selection signal of 3 bits (S0, S1 and S2) from an examination controller (CPU 66 can be designed to function as such a controller as well), and selects one of the output terminals Y1 to Y7 in accordance with the 3-bit group selection signal. The selected output terminal Yi is applied with an "H"-level voltage.

Figure 13:
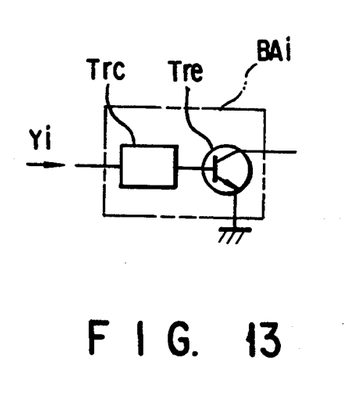
FIG. 13 is a circuit diagram showing the buffer amplifier depicted in the block circuit diagram in FIG. 6.

In the present embodiment, each of buffer amplifiers BA1 to BA7 is a TTL (transistor coupled transistor logic) circuit which comprises a coupling circuit Trc located at the input side, and an O/C (open collector) transistor Tre located at the output side as shown in FIG. 13. To be more specific, the collector of transistor Tre serves as the output terminal of the buffer amplifier, and is connected to both the cathodes of all light-emitting elements of the corresponding group and the emitters of all light-receiving elements of the corresponding group. The emitter of transistor Tre is grounded. When an "H"-level voltage is applied to the input terminal of the buffer amplifier BAi, the output terminal of the buffer amplifier BAi (i.e., the collector of transistor Tre) is grounded by way of the emitter of transistor Tre and therefore becomes "L" in level.

In the state where the output terminal of the buffer amplifier BAi is at the "L" level (i.e., the condition of being grounded), a current caused by the high-frequency power supply 60 flows between the anode and cathode of each of all light-emitting elements that are connected to the output terminal of buffer amplifier BAi, with the result that the light-emitting elements emit light in synchronism with the frequency of the high-frequency power supply 60. The selection signal (S0, S1 and S2) changes in value at predetermined cycles such that the output terminals Y1 to Y7 of the selector circuit 70 become an "H" level one by one on the time divisional basis.

In the state where the output terminal of the buffer amplifier BAi is at the "L" level (i.e., the condition of being grounded), the emitter of each of the light-receiving elements is "L" in level. Therefore, if no wafer W is located between the light-emitting element and the light-receiving element, the light emitted by the light-emitting element is received by the light-receiving element, and a current caused by the power supply terminal +V0 connected to the collector of the light-receiving element flows through the light-receiving element. As a result, in synchronism with the light emitting frequency of the light-emitting element, the collector of the light-receiving element changes in level from "H", which is due to the potential level of the power supply terminal +V0, to "L".

Let us consider the case where wafers W1, W2 and W4 are at their respective wafer detection positions and wafer W3 is not. In this case, light-receiving elements Q1, Q2 and Q4 are kept off, and light-receiving element Q3 is turned on. Therefore, the collectors (i.e., the output terminals) of light-receiving elements Q1, Q2 and Q4 remain at "H" level, but the collector (i.e., the output terminal) of light-receiving element Q3 changes from "H" level to "L" level. As a result, a wafer detection signal whose frequency is determined in accordance with the light from the light-emitting diode is output from the collector of light-receiving element Q3. After removal of unnecessary frequency components by means of band-pass filter BPF3, the wafer detection signal is supplied to integrator INT3, for conversion into a d.c. level signal. The d.c. level signal is converted into a digital signal by means of the multiplexer 62 and the A/D converter 64, and the digital signal, thus obtained, is supplied to CPU 66.

When wafer detection is performed in the first group, the output terminals of buffer amplifiers BA2 to BA7 (i.e., the buffer amplifiers other than buffer amplifier BA1) are in the high-impedance state. In other words, the emitters of the light-receiving elements of the second to seventh groups are maintained in the nongrounded state. In the second to seventh groups, therefore, all light-emitting elements are OFF (i.e., none of the light-emitting elements emit light), and all light-receiving elements are in the disenabled state (i.e., none of the light-receiving elements are turned on even when light greater than a threshold value is incident on them). Accordingly, an erroneous wafer detection signal is prevented from being generated and supplied to CPU 66. For example, even when the light greater than the predetermined threshold value is incident on the light-receiving surface of light-receiving element Q5 at a frequency close to the light emission frequency of the corresponding light-emitting diode, light-receiving element Q5 is not turned on, and no wafer detection signal is generated.

Figure 14:
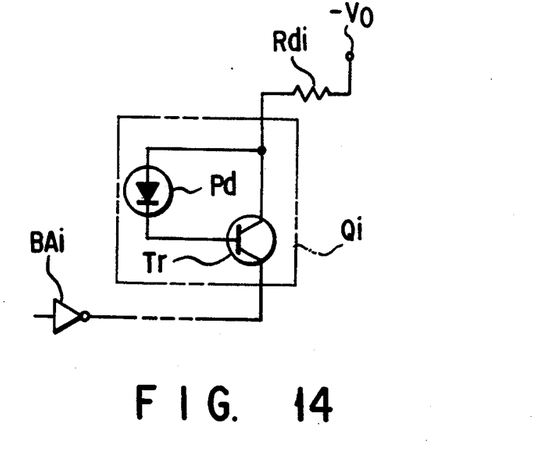
FIG. 14 is a circuit diagram showing a modification of a light-receiving element depicted in FIG. 6.

In the embodiment described above, the light-receiving elements Q1 to Q25 are made by phototransistors. However, this in no way limits the present invention. Each of the light-receiving elements may be a combination of photodiode Pd and transistor Tr, as shown in FIG. 14.

A description will now be given, with reference to FIGS. 7 and 8, of the second feature of the electric circuit of the subject wafer-detecting apparatus.

In the case where wafers to be detected are not transparent, such as silicon wafers, the light incident on the light-receiving surface of light-receiving element Qi significantly differs between the case where a wafer is located between the light-emitting Pi and light-receiving elements Qi and the case where no wafer is located therebetween. Since the output signal level of the light-receiving element Qi significantly differs between the two cases, the wafer presence/absence determination can be easily made. However, in the case where wafers to be detected are transparent or semitransparent and do not completely shield light, the intensity of the light incident on the light-receiving surface of light-receiving element Qi does not significantly differ between the two cases. Since, therefore, the output signal level of the light-receiving element Qi does not significantly differ between the two cases, the wafer presence/absence determination cannot be easily made.

In a conventional wafer-detecting apparatus of this type, the same threshold value is determined for all wafer-detecting means (P1, Q1) to (P25, Q25), and the threshold value is fixed even when wafers to be detected are transparent or semitransparent. The output signal level of each light-receiving element is compared with the threshold value, and the presence or absence of a wafer is determined on the basis of that comparison. However, if the wafer-detecting means (P1, Q1) to (P25, Q25) are different in detection sensitivity, as shown in FIG. 7, it may happen that determination of the presence or absence of some of the wafers cannot be made, as long as the same threshold value is used.

Figure 7:
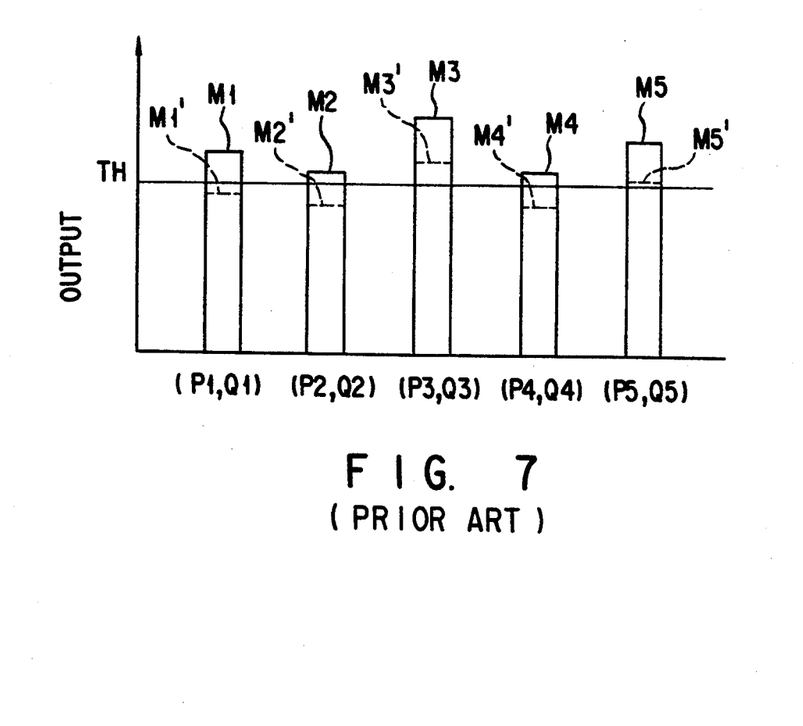
FIG. 7 is a graph for illustrating the problem entailed in the wafer presence/absence determination system of a conventional wafer-detecting apparatus.
Figure 8:
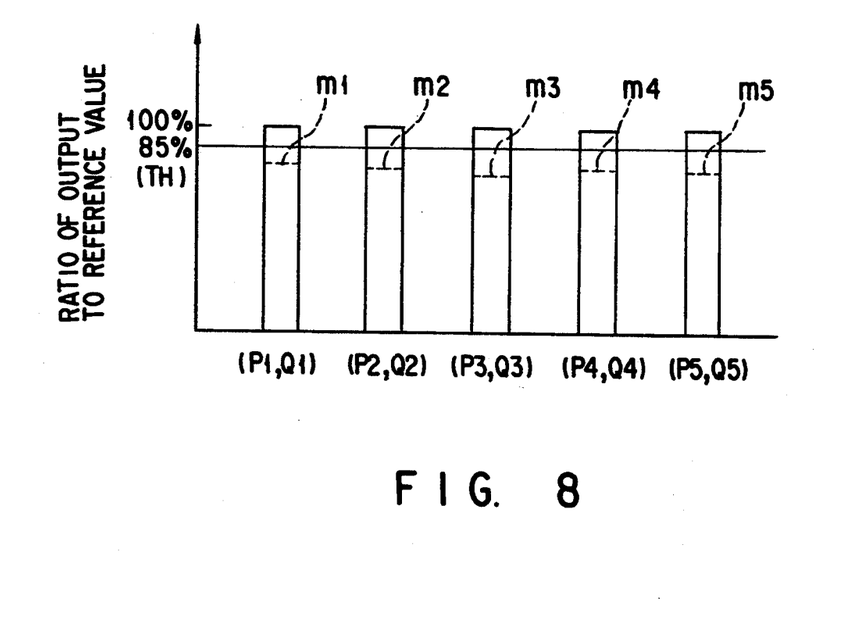
FIG. 8 is a graph for illustrating one of the technical concepts which the wafer-detecting method of the present invention uses for the wafer presence/absence determination.

In FIG. 7, solid lines M1, M2 . . . indicate the levels of the signals which the light-receiving elements Q1, Q2 . . . of the wafer-detecting means (P1, Q1), (P2, Q2) . . . output when wafers are not at their respective wafer detection positions, while broken lines M1', M2' . . . indicate the levels of the signals which the light-receiving elements Q1, Q2 . . . output when wafers are at their respective wafer detection positions. If the wafers are transparent or semitransparent, the levels of the output signals of the light-receiving elements do not have such clear differences as are indicated in FIG. 7. In FIG. 7, the detection sensitivity of wafer-detecting means (P3, Q3) is higher than the detection sensitivities of the other wafer-detecting means, and the level of the signal which light-receiving element Q3 of the wafer-detecting means (P3, Q3) outputs when a wafer is located at its detection position is greater than the threshold value. This results in a determination error.

If a threshold value TH greater than the level indicated by M3' is used to solve the problem, then wafer-detecting means (P2, Q2) and (P4, Q4) cannot make a wafer presence/absence determination. It may be thought to determine different threshold values for the respective wafer-detecting means (P1, Q1), (P2, Q2) . . . in accordance with the detection sensitivities. If this is done, however, the signal processing is inevitably complicated. In addition, since the detection sensitivity of each wafer-detecting means is likely vary with time, it is necessary to redetermine or alter the threshold values. It is, therefore, not practical to determine different threshold values for the respective wafer-detecting means (P1, Q1), (P2, Q2) . . .

The wafer-detecting apparatus of the present invention has solved this problem, as follows.

CPU 66 employed in the present invention controls the memory 68 to store data on the values of the signals which light-receiving elements Q1–Q25 output when wafers W1 to W25 are not at their respective wafer detection positions. The values stored in the memory 68 are used as standard values. When the absence or absence of wafers is determined or when the number of wafers is checked, the values of the output signals of the light-receiving elements Q1–Q25 are divided by the corresponding standard values stored in the memory 68. If no wafer is located at its wafer detection position, the quotient or the percentage obtained by the division is substantially 100%. On the other hand, if a wafer is located at its wafer detection position, the percentage is, for example, 70% or so, as indicated by the broken lines m1, m2 . . . in FIG. 8. The difference between the two percentages is substantially the same, irrespective of the detection sensitivity differences among the wafer-detecting means (P1, Q1) to (P25, Q25). It is therefore possible to use, for example, a value of 85% as a threshold value for all wafer-detecting means (P1, Q1) to (P25, Q25). In this manner, the presence or absence of even transparent or semitransparent wafers W1 to W25 can be easily determined in spite of the detection sensitivity difference among the wafer-detecting means (P1, Q1) to (P25, Q25).

A description will now be given of the third feature of the electric circuit of the subject wafer-detecting apparatus. In the case where the wafers to be detected are transparent (e.g., glass wafers) or semitransparent, the wafer chuck 18 is so driven as to permit a batch of wafers W1 to W25 to pass through the wafer detection positions Z1 to Z25. When the wafer chuck 18 is driven in this manner, the relative positional relationships between the wafers Wi and the wafer-detecting means (Pi, Qi) change with time, and a wafer detection signal has such a waveform as is shown in FIG. 10. In FIG. 10, the points indicated by (A) to (E) correspond to the relative positional relationships depicted in (A) to (E) of FIG. 9, respectively.

Figure 9:
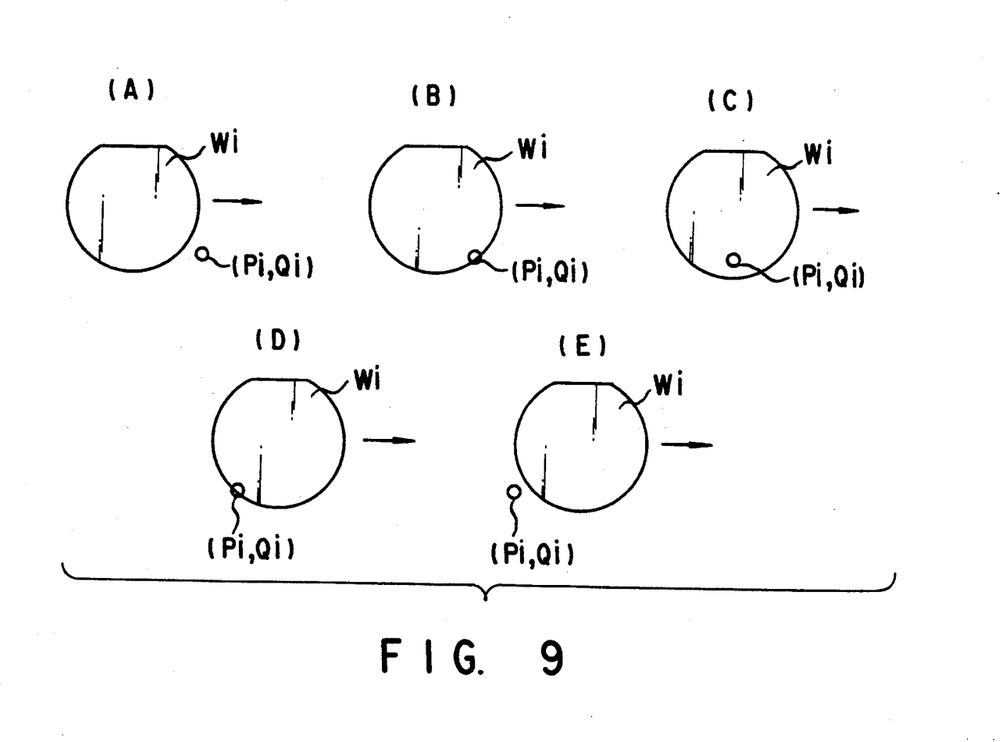
FIG. 9 is a diagram for illustrating another one of the technical concepts which the wafer-detecting method of the present invention uses for the wafer presence/absence determination.
Figure 10:
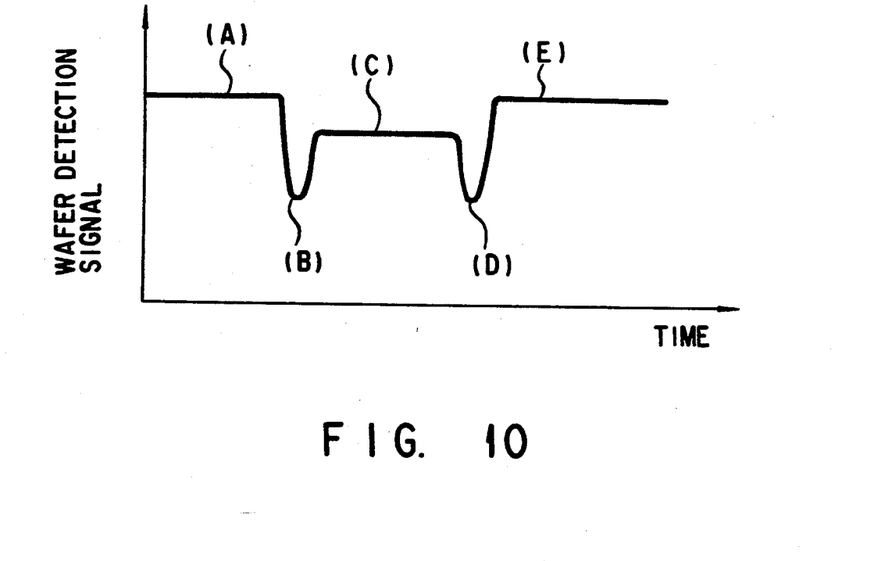
FIG. 10 is a graph showing the waveform of a wafer detection signal corresponding to the technical concept depicted in FIG. 9.

When, as indicated in (A) of FIG. 9, the lower portion of wafer Wi has not yet passed through the optical axis of wafer-detecting means (Pi, Qi), the light from light-emitting element Pi is incident directly on light-receiving element Qi, and the detected light is at the highest level. When, as indicated in (B) of FIG. 9, the edge of wafer Wi has reached the optical axis of wafer-detecting means (Pi, Qi), the light from light-emitting element Pi is scattered by the edge of wafer Wi, and the detected light rapidly drops in level, as indicated by (B) in FIG. 10. When, as indicated in (C) of FIG. 9, the lower portion of wafer Wi is passing through the optical axis of wafer-detecting means (Pi, Qi), the light from light-emitting element Pi is transmitted through wafer Wi, without being scattered, and is then incident on light-receiving element Qi. Therefore, the level of the detected light is lower than the highest level by the value corresponding to the light intensity attenuation caused in wafer Wi, as indicated by (C) in FIG. 10. When, as indicated in (D) of FIG. 9, the lower portion of wafer Wi is about to move away from the optical axis of wafer-detecting means (Pi, Qi), the edge of wafer Wi is located at the optical axis of wafer-detecting means (Pi, Qi). Therefore, the detected light drops in level again, as indicated by (D) in FIG. 10. After the lower portion of wafer Wi has passed through the optical axis, as indicated in (E) of FIG. 9, the light from light-emitting element Pi is incident directly on light-receiving element Qi, and the detected light is at the highest level again.

As described above, when transparent or semitransparent wafer Wi passes through wafer detection position Zi, the light detected by wafer-detecting means (Pi, Qi) drops in level twice, as indicated by (B) and (D) in FIG. 10. On the basis of these level drops, it is possible to easily determine whether a wafer is present or absent.

In the above, the wafer chuck 18 is described as being driven to move a batch of wafers W1 to W25 through wafer detection positions Z1 to Z25. Needless to say, what is driven need not be the wafer chuck 18. The same advantages as described above can be obtained even when the subject wafer-detecting apparatus is moved, with the wafer chuck 18 and wafers W1 to W25 being kept stationary.

Figure 11:
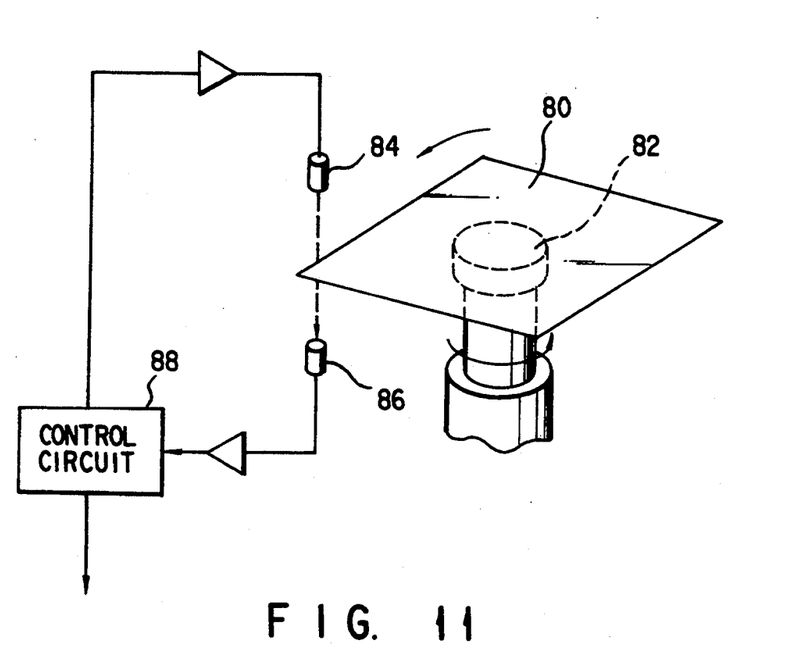
FIG. 11 is a schematic perspective view showing an LCD substrate position-detecting apparatus which utilizes the technical concept depicted in FIG. 9.

FIG. 11 shows an example in which the above-described third feature of the electric circuit is applied to another use. Referring to FIG. 11, an LCD substrate 80 is sucked and held on a spin chuck (turntable) 82, for executing predetermined processing (e.g., resist coating). In order to ensure uniform processing in this type of rotary processing apparatus, the LCD substrate 80 has to be positioned with reference to the spin chuck 82 with high accuracy. In particular, the center of the LCD substrate 80 has to be accurately aligned with that of the spin chuck 82. Before the processing of the LCD substrate is started, it is necessary to check whether or not the LCD substrate 80 is accurately positioned with reference to the spin chuck 82, but since the LCD substrate is formed of transparent glass, the conventional optical detection method does not enable reliable detection of the position of the LCD substrate 80. In the apparatus shown in FIG. 11, the spin chuck 82 is arranged in such a manner that the four corners of the rotated LCD substrate 80 pass through the optical path between the light-emitting element 84 and the light-receiving element 86. With this arrangement, a signal having a waveform similar to that shown in FIG. 10 is produced from the output terminal of the light-receiving element 86. On the basis of the signal, a control circuit 88 can determine whether or not the LCD substrate 80 is shifted from the right position. An automatic positional shift corrector may be additionally employed. Where this type of positional shift corrector is employed, a signal representing a positional shift of the LCD substrate 80 is fed back to the positional shift corrector, for automatic correction of the position of the LCD substrate.

The present invention is applicable not only to semiconductor wafers or LCD substrates but also to any type of substrates as long as the substrates are plate-like substrates. In addition, the present invention is not only applicable to a determination of the presence or absence of substrates or to a check for counting the number of substrates, out it can be applied to any kind of determination or check as long as the application is within the spirit and scope of the invention.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An apparatus for detecting a plurality of substrates arranged substantially parallel to one another at intervals, said apparatus comprising:
   a support member;
   a pair of substantially parallel longitudinal channels which are formed in the support member, with a distance therebetween;
   a plurality of substantially parallel transverse channels which are formed in the support member at intervals such that a plurality of pairs of holding recesses are respectively formed between adjacent ones of the transverse channels by the longitudinal channels, said transverse channels being substantially perpendicular to the longitudinal channels, said intervals of the transverse channels corresponding to the intervals at which the plurality of substrates are arranged; and a plurality of pairs of light-emitting and light-receiving elements arranged such that a pair of light-emitting elements and a pair of light-receiving elements are alternately arranged in said pairs of holding recesses, said light-emitting elements of each pair having light-emitting faces oriented in opposite directions, said light-receiving elements of each pair having light-receiving faces oriented in opposite directions, said light-emitting elements of each pair being associated with light-receiving elements facing thereto so as to jointly constitute respective optical sensors, wherein each of the optical sensors determines the presence or absence of a substrate by detecting whether or not light between the light-emitting and light-receiving elements is shielded.

2. The apparatus according to claim 1, wherein each of said holding recesses has a pair of grooves formed in opposite side faces which serve as side walls of the longitudinal channels, one of the light-emitting and light-receiving elements being fitted in said pair of grooves.

3. The apparatus according to claim 1, wherein said optical sensors are divided into a plurality of groups, and said apparatus further comprises selecting means for outputting ON signals on a time divisional basis, each of said ON signals permitting the light-emitting elements of the optical sensors of one group to emit light and permitting the light-receiving elements of the optical sensors of said one group to be set in an enabled state.

4. The apparatus according to claim 3, wherein:
said optical sensors include first to fourth optical sensors; and
said apparatus further comprises:
first reading means, electrically connected to output terminals of the light-receiving elements of the first and third optical sensors, for reading output signals of the first and third optical sensors;
second reading means, electrically connected to output terminals of the light-receiving elements of the second and fourth optical sensors, for reading output signals of the second and fourth optical sensors;
normally-open first switching means electrically connected to input terminals of the light-receiving elements of the first and second optical sensors; and
normally-open second switching means electrically connected to input terminals of the light-receiving elements of the third and fourth optical sensors; wherein
said selecting means outputting first and second ON signals on a time divisional basis, said first ON signal controlling the light-emitting elements of the first and second optical sensors to emit light and closing the first switching means to set the light-receiving elements of the first and second optical sensors in an enabled state, said second ON signal controlling the light-emitting elements of the third and fourth optical sensors to emit light and closing the second switching means to set the light-receiving elements of the third and fourth optical sensors in an enabled state.

5. The apparatus according to claim 4, wherein:
said output terminals of the light-receiving elements of the first and third optical sensors and said output terminals of the light-receiving elements of the second and fourth optical sensors are connected to bias voltage-applying means;
said input terminals of the light-receiving elements of the first and second optical sensors are grounded by way of the first switching means; and
said input terminals of the light-receiving elements of the third and fourth optical sensors are grounded by way of the second switching means.

6. The apparatus according to claim 5, wherein:
said light-emitting elements of the first to fourth optical sensors comprise semiconductor light-emitting elements each having first and second terminals;
said first terminals of the semiconductor light-emitting elements of the first to fourth optical sensors are connected to high-frequency voltage-applying means;
said second terminals of the semiconductor light-emitting elements of the first and second optical sensors are grounded by way of the first switching means; and
said second terminals of the semiconductor light-emitting elements of the third and fourth optical sensors are grounded by way of the second switching means.

7. An apparatus for detecting a plurality of substrates arranged substantially parallel to one another at intervals, said apparatus comprising:
support means;
a plurality of optical sensors including at least first to fourth optical sensors which are supported by the support means and which are arranged at intervals corresponding to the intervals at which the substrates are arranged, each of said plurality of optical sensors being made up of one light-emitting element and one light-receiving element and determining the presence or absence of a substrate by detecting whether or not light between the light-emitting and light-receiving elements is shielded;
first reading means, electrically connected to output terminals of the light-receiving elements of the first and third optical sensors, for reading output signals of the first and third optical sensors;
second reading means, electrically connected to output terminals of the light-receiving elements of the second and fourth optical sensors, for reading output signals of the second and fourth optical sensors;
normally-open first switching means electrically connected to input terminals of the light-receiving elements of the first and second optical sensors;
normally-open second switching means electrically connected to input terminals of the light-receiving elements of the third and fourth optical sensors; and
selecting means for outputting first and second ON signals on a time divisional basis, said first ON signal controlling the light-emitting elements of the first and second optical sensors to emit light and closing the first switching means to set the light-receiving elements of the first and second optical sensors in an enabled state, said second ON signal controlling the light-emitting elements of the third and fourth optical sensors to emit light and closing the second switching means to set the light-receiving elements of the third and fourth optical sensors in an enabled state.

8. The apparatus according to claim 7, wherein:
said output terminals of the light-receiving elements of the first and third optical sensors and said output terminals of the light-receiving elements of the second and fourth optical sensors are connected to bias voltage-applying means;

said input terminals of the light-receiving elements of the first and second optical sensors are grounded by way of the first switching means; and said input terminals of the light-receiving elements of the third and fourth optical sensors are grounded by way of the second switching means.

9. The apparatus according to claim 8, wherein:

said light-emitting elements of the first to fourth optical sensors comprise semiconductor light-emitting elements each having first and second terminals;

said first terminals of the semiconductor light-emitting elements of the first to fourth optical sensors are connected to high-frequency voltage-applying means;

said second terminals of the semiconductor light-emitting elements of the first and second optical sensors are grounded by way of the first switching means; and said second terminals of the semiconductor light-emitting elements of the third and fourth optical sensors are grounded by way of the second switching means.

10. The apparatus according to claim 9, wherein each of said output terminals of the light-receiving elements of the first and third optical sensors and said first reading means are connected through a first band-pass filter, and each of said output terminals of the light-receiving elements of the second and fourth optical sensors and said second reading means are connected through a second band-pass filter, such that unnecessary frequency components are removed from the output signals of the light-receiving elements by said first and second band-pass filters.

11. The apparatus according to claim 10, wherein each of said light-emitting elements of the first to fourth optical sensors comprises a light-emitting diode, said first terminal of each light-emitting element is an anode of the light-emitting diode, and said second terminal of each light-emitting element is a cathode of the light-emitting diode.

12. The apparatus according to claim 11, wherein each of said light-receiving elements of the first to fourth optical sensors comprises a phototransistor, the output terminal of each light-receiving element is a collector of the phototransistor, and the input terminal of each light-receiving element is an emitter of the phototransistor.

13. The apparatus according to claim 11, wherein each of the light-receiving elements of the first to fourth optical sensors comprises a photodiode, and a transistor which is turned on or off by the photodiode, the output terminal of each light-receiving element is a collector of the transistor, and the input terminal of each light-receiving element is an emitter of the transistor.

14. A method for detecting a plurality of substrates arranged substantially parallel to one another at intervals, said method comprising the steps of:

arranging a plurality of optical sensors at intervals corresponding to the intervals at which the substrates are arranged, each of said optical sensors being made up of one light-emitting element and one light-receiving element;

positioning the substrates with reference to the optical sensors, such that one of the substrates is inserted between the light-emitting and light-receiving elements of one of the optical sensors;

dividing said optical sensors into a plurality of groups, and outputting ON signals on a time divisional basis, each of said ON signals permitting the light-emitting elements of the optical sensors of one group to emit light and permitting the light-receiving elements of the optical sensors of said one group to be set in an enabled state; and determining the presence or absence of a substrate by reading how an output of the light-receiving element varies depending upon whether or not light between the light-emitting and the light-receiving elements is shielded, said output of each light-receiving element is filtered by a band-pass filter to remove unnecessary frequency components therefrom before being read.

15. The method according to claim 14, wherein the presence or absence of the substrate is determined on the basis of a ratio of a detection value to a standard value, said detection value being a value of a signal which the light-receiving element outputs when the substrate is detected, and said standard value being a value of a signal which the light-receiving element outputs when light emitted from the light-emitting element is received by the light-receiving element without being shielded.

16. The method according to claim 15, wherein the presence or absence of the substrate is determined on the basis of said ratio where the substrate is formed of a transparent or semitransparent material.

17. The method according to claim 14, wherein the output of the light-receiving element is read while moving the substrate and the optical sensor relative to each other.

18. The method according to claim 17, wherein the reading of the output of the light-receiving element is continued when an edge of the substrate is passing through a region between the light-emitting element and the light-receiving element, and the presence or absence of the substrate is determined by detecting how the output of the light-receiving element varies when the edge of the substrate passes through said region.

19. The method according to claim 18, wherein the presence or absence of the substrate is determined by detecting how the output of the light-receiving element varies when the edge of the substrate passes through said region, where the substrate is formed of a transparent on semitransparent material.

* * * * *

UNITED STATES PATENT AND TRADEMARK OFFICE
CERTIFICATE OF CORRECTION

PATENT NO. : 5,406,092
DATED : April 11, 1995
INVENTOR(S) : Shori MOKUO

It is certified that error appears in the above-indentified patent and that said Letters Patent is hereby corrected as shown below:

On the title page, Item [54], and Column 1, Line 4, the title should read:

--APPARATUS AND METHOD USING OPTICAL SENSORS RECESSED IN CHANNEL WALLS FOR DETECTING SUBSTRATES IN A SUPPORT--

Signed and Sealed this

Fourth Day of July, 1995

Attest:

BRUCE LEHMAN

Attesting Officer

Commissioner of Patents and Trademarks